(12) United States Patent
Barrenscheen

(10) Patent No.: US 8,855,181 B2
(45) Date of Patent: Oct. 7, 2014

(54) METHOD AND SYSTEM FOR COMPENSATING A DELAY MISMATCH BETWEEN A FIRST MEASUREMENT CHANNEL AND A SECOND MEASUREMENT CHANNEL

(71) Applicant: Infineon Technologies AG, Neubiberg (DE)

(72) Inventor: Jens Barrenscheen, Munich (DE)

(73) Assignee: Infineon Technologies AG, Neubiberg (DE)

( * ) Notice: Subject to any disclaimer, the term of this patent is extended or adjusted under 35 U.S.C. 154(b) by 5 days.

(21) Appl. No.: 13/760,198

(22) Filed: Feb. 6, 2013

(65) Prior Publication Data

US 2013/0223497 A1 Aug. 29, 2013

Related U.S. Application Data

(60) Provisional application No. 61/602,979, filed on Feb. 24, 2012.

(51) Int. Cl.
*H04L 12/26* (2006.01)
*H04L 7/00* (2006.01)
*H03M 1/12* (2006.01)
*H02P 27/08* (2006.01)

(52) U.S. Cl.
CPC .............. *H04L 7/0033* (2013.01); *H03M 1/12* (2013.01); *H02P 27/08* (2013.01)
USPC ........... 375/224; 375/296; 375/297; 375/298; 375/219; 375/295; 375/226

(58) Field of Classification Search
CPC ..... H04L 7/0033; H04L 27/364; H04L 27/34; H04L 27/2017; H03M 1/22; H02P 27/08
USPC ........... 375/295–298, 219–224; 341/188, 144
See application file for complete search history.

(56) References Cited

U.S. PATENT DOCUMENTS 7,889,811 B2 * 2/2011 Byun et al. .................. 375/297
8,094,054 B2 * 1/2012 Helfenstein et al. .......... 375/296

* cited by examiner

*Primary Examiner* — Lam T Mai
(74) *Attorney, Agent, or Firm* — Eschweiler & Associates, LLC

(57) ABSTRACT

A method and a system for compensating a delay mismatch between a first measurement channel and a second measurement channel is disclosed. A method for compensating a delay mismatch between a first measurement channel and a second measurement channel includes providing a reference point for starting the first and second measurement channel, and starting the first measurement channel after expiration of a first delay period which begins at the reference point. The method further includes starting the second measurement channel after expiry of a second delay period which begins at the reference point, wherein a difference between a length of the first delay period and a length of the second delay period is substantially equal to the delay mismatch between the first measurement channel and the second measurement channel.

21 Claims, 1 Drawing Sheet

METHOD AND SYSTEM FOR COMPENSATING A DELAY MISMATCH BETWEEN A FIRST MEASUREMENT CHANNEL AND A SECOND MEASUREMENT CHANNEL

FIELD

The disclosure relates to a method and a system for compensating a delay mismatch between a first measurement channel and a second measurement channel.

BACKGROUND

In many applications (such as AC motor control with current measurement in the phase nodes), sigma-delta analog digital converters (ADCs) are often used because they allow a cost effective isolation of the data streams (they do not refer to the same ground potential).

Although in such applications similar sensors (shunts) are used, a later analog treatment and filtering (e.g. by amplifiers or passive components with tolerances) can lead to a mismatch in the delay between the measurement channels. This leads to the effect that the conversion results do not relate to the same point in time.

If the input signals are converted and the results are used in combination with other signals (e.g. another input signal or a reference signal), the mismatch in the delay leads to an undesired reduction of the ENOB value of the converters (ENOB=effective numbers of bits which can be considered as resolution of the converter).

In the case that different sensor types are used (e.g. voltage and current sensors for power meters), it is also very important to take conversion values that correspond to the same point in time. However, using different sensor types may already lead to a significant delay mismatch.

In telecommunication, such effects are solved by later numeric treatment of the conversion results, because in this field, equivalent computation is done anyhow.

In AC motor control and other applications, especially for low-cost consumer markets, the computing power to solve this problem in a numerical way is not available. As a result, a simple mechanism to minimize the delay mismatch before using the results is advantageous. Furthermore (and contrary to telecommunication applications), in AC motor control, each conversion result is not necessarily taken into account, but only those values are of interest that are located in a defined measurement window (e.g. synchronized to a PWM signal).

Therefore, there exists a need for a method and a system for minimizing delay mismatch between two measurement channels that is simple and cost effective.

SUMMARY

In accordance with an aspect of the disclosure, there is provided a method for compensating a delay mismatch between a first measurement channel and a second measurement channel. The method comprises providing a reference point for starting the first and second measurement channel, and starting the first measurement channel after expiration of a first delay period that begins at the reference point. The method further comprises starting the second measurement channel after expiration of a second delay period which begins at the reference point, wherein a difference between a length of the first delay period and a length of the second delay period is substantially equal to the delay mismatch between the first measurement channel and the second measurement channel.

In accordance with a further aspect of the disclosure, there is provided a system for compensating a delay mismatch between a first measurement channel and a second measurement channel. The system comprises first means for starting the first measurement channel after expiration of a first delay period starting at a predefined reference point and second means for starting the second measurement channel after expiration of a second delay period starting at the predefined reference point. A difference between a length of the first delay period and a length of the second delay period is substantially equal to the delay mismatch between the first measurement channel and the second measurement channel.

Further features, aspects and advantages of the present disclosure will become apparent from the following detailed description of the disclosure made with reference to the accompanying drawings.

BRIEF DESCRIPTION OF THE DRAWING(S)

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated as they become better understood by reference to the following detailed description.

DETAILED DESCRIPTION

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

In many applications (such as AC motor control with current measurement, for example) in which sigma-delta analog to digital converters (ADCs) are used, delay mismatch between two sigma-delta ADC measurement channels may occur. Such a delay mismatch entails the fact that two conversion results—though output at the same time—do not refer to the same time point. Since in many applications, such as AC motor control, for example, the computing power for compensating such a delay mismatch in a numerical way is not available, another approach for compensating such a delay mismatch is required.

Therefore, a simple mechanism and, thus, cost-effective approach for compensating a delay mismatch between sigma-delta ADC measurement channels is suggested which minimizes the delay mismatch before the results are used.

Figure 1:
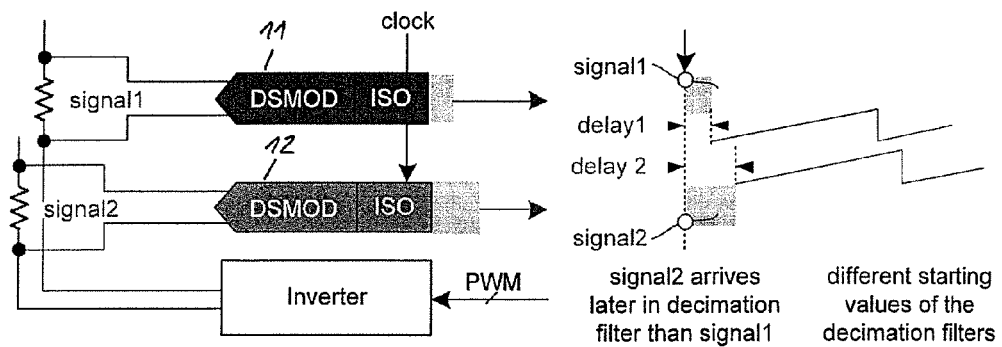
FIG. 1 shows a simplified schematic diagram of a system comprising two sigma-delta ADC measurement channels according to one embodiment.

FIG. 1 exemplarily shows a simplified schematic diagram of a system comprising two sigma-delta ADC measurement channels. In each measurement channel, a sigma-delta modulator 11, 12 outputs digital samples to a decimator or decimation filter. A decimation sequence consists of inputting N input samples into a filter structure of the decimator. On the right side of FIG. 1, two saw tooth signals indicate the number of already treated input samples for the two measurement channels. When reaching N, a decimated sample value is output and the decimation sequence starts again. The number N is also named an oversampling ratio (OSR).

The easiest way to achieve this behavior is using a decimation counter counting the number of treated input samples. When reaching N−1, it continues with 0, 1, etc. As can be learned from FIG. 1, the delay mismatch can be minimized if the decimation sequences for both channels are started at different points in time, e.g. after two different delays referring to a predefined reference point.

In the following, two example embodiments for providing adjustable delays are described.

In the first example embodiment, each measurement channel may include a timer structure for setting an adjustable delay. The decimation counter of the first sigma-delta ADC is started after a first (adjustable) delay set by the a first timer structure comprised in the first measurement channel and the decimation counter of the second sigma-delta ADC is started after a second (adjustable) delay set by the a second timer structure comprised in the second measurement channel, wherein both delays refer to the same reference time point.

In the second example embodiment, each measurement channel may comprise means for reloading the decimation counter of each sigma-delta ADC with an adjustable value to emulate an already ongoing decimation sequence, i.e. the decimation counter starts with an adjustable value smaller than the OSR value (instead of the usual starting value 0). This method leads to the same effect, starting the decimation counters of the ADCs at different times, but does not need an additional timer structure. Like this, a delay mismatch of more than one decimation period can be supported without adding intermediate buffer stages to store the decimated samples.

Furthermore, already existing hardware in sigma-delta ADCs may advantageously be modified to further adjust the length of the delay periods over a wider range. In a sigma-delta ADC, a certain number of decimation samples (outputs of the decimation filter when the decimation counter reaches the OSR value) are usually discarded after a reference trigger signal indicates the start of the measurement to let the modulator and the decimation filter settle.

According to one embodiment, the number of decimation samples that are discarded may be adjustable independently for each channel. That way, a delay mismatch can be compensated for over a wide range (over several decimation samples).

With this structure, it is also easily possible to create a measurement window with respect to a reference time point, e.g. delivered by a PWM generator. To avoid measurements when there is a lot of switching noise, a measurement window can be defined in a time period, in which no switch state changing takes place. Adding the value needed for the delay compensation between the channels to the delay between the reference time point and the start of the measurement window, both effects can be handled easily with the same hardware means.

Figure 2:
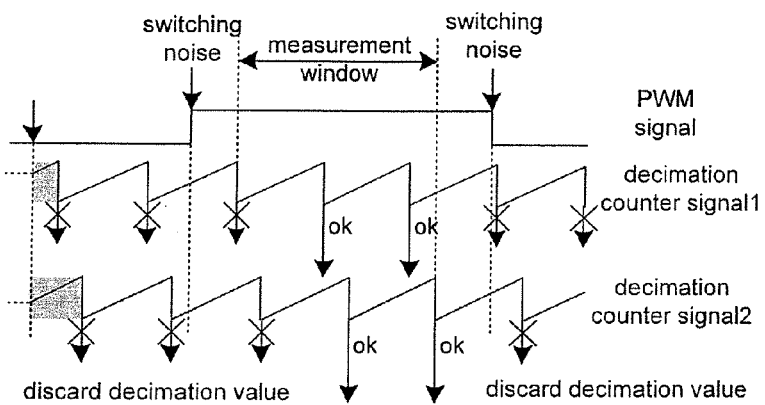
FIG. 2 illustrates an application for the system shown in FIG. 1 according to one embodiment.

FIG. 2 shows a graphical illustration of a mechanism for minimizing or compensating a delay mismatch between two sigma-delta ADC measurement channels, wherein a measurement window is created in a time period in which no switch state changing takes place.

In this embodiment, decimation counters of the sigma-delta ADCs are reloaded with respect to a timing reference to introduce an adjustable delay for compensating a delay mismatch between two sigma-delta ADC measurement channels. Further, a certain number, e.g. 3, decimation samples are discarded to ensure that the decimation samples which are output as ADC conversion result values lie within a predefined measurement window. Though the number of discarded decimation samples is the same for both measurement channels in this example, the number of discarded decimation samples may also be adjusted to be different for the two channels if a larger delay mismatch between the two measurement channels is to be compensated.

Thus, a delay mismatch can be compensated in a wide range (over several decimation samples) with a granularity of input samples by reloading decimation counters and discarding decimation samples, wherein the number of discarded decimation samples is independently adjustable for each measurement channel.

In this context it is to be appreciated that decimated measurement results at the outputs of the filter stages are not generated at the same point in time, but the results reflect the analog input voltages at the same point in time.

In case the magnitude of the delay mismatch between two measurement channels is not known, a reference measurement may be carried out, wherein reference measurement input values are applied to the two measurement channels to determine the magnitude of the delay mismatch between the two measurement channels.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method for compensating a delay mismatch between a first measurement channel and a second measurement channel, comprising:
    providing a reference point for starting the first measurement channel and the second measurement channel;
    starting the first measurement channel after expiration of a first delay period which begins at the reference point; and
    starting the second measurement channel after expiration of a second delay period which begins at the reference point;
    wherein a difference between a length of the first delay period and a length of the second delay period is substantially equal to the delay mismatch between the first measurement channel and the second measurement channel.

2. The method of claim 1, wherein the delay mismatch between the first measurement channel and the second measurement channel is determined in a reference measurement, wherein reference measurement input values are applied to the first measurement channel and the second measurement channel.

3. The method of claim 1, wherein the first delay period is set and/or adjusted using a first timer structure and the second delay period is set and/or adjusted using a second timer structure.

4. The method of claim 1, wherein a first sigma-delta analog to digital converter (ADC) is comprised in the first measurement channel and a second sigma-delta ADC is comprised in the second measurement channel.

5. The method of claim 4, wherein the first delay period is set and/or adjusted using a first timer structure in the first measurement channel and the second delay period is set and/or adjusted using a second timer structure in the second measurement channel; and
a first decimation counter of the first sigma-delta ADC is started after the first delay period and a second decimation counter of the second sigma-delta ADC is started after the second delay period.

6. The method of claim 4, wherein a first number of decimation samples output by a first decimation filter of the first sigma-delta ADC are discarded, wherein the first number of discarded decimation samples is adjustable to further adjust the first delay period, and wherein a second number of decimation samples output by a second decimation filter of the second sigma-delta ADC are discarded, wherein the second number of discarded decimation samples is adjustable to further adjust the second delay period, and wherein the first number of discarded decimation samples and the second number of discarded decimation samples are the same or are different.

7. The method of claim 4, wherein the first delay period is set and/or adjusted by reloading a first decimation counter of the first sigma-delta ADC with a first adjustable value and the second delay period is set and/or adjusted by reloading a second decimation counter of the second sigma-delta ADC with a second adjustable value.

8. The method of claim 7, wherein a first number of decimation samples output by a first decimation filter of the first sigma-delta ADC are discarded, wherein the first number of discarded decimation samples is adjustable to further adjust the first delay period, and wherein a second number of decimation samples output by a second decimation filter of the second sigma-delta ADC are discarded, wherein the second number of discarded decimation samples is adjustable to further adjust the second delay period, and wherein the first number of discarded decimation samples and the second number of discarded decimation samples are the same or are different.

9. A system for compensating a delay mismatch between a first measurement channel and a second measurement channel, the system comprising:
first means for starting the first measurement channel after expiration of a first delay period starting at a predefined reference point; and
second means for starting the second measurement channel after expiration of a second delay period starting at the predefined reference point;
wherein a difference between a length of the first delay period and a length of the second delay period is substantially equal to the delay mismatch between the first measurement channel and the second measurement channel.

10. The system of claim 9, wherein the delay mismatch between the first measurement channel and the second measurement channel is determined in a reference measurement, wherein reference measurement input values are applied to the first measurement channel and the second measurement channel.

11. The system of claim 9, wherein:
the first means for starting the first measurement channel after expiration of the first delay period comprises a first timer structure;
the second means for starting the second measurement channel after expiration of the second delay period comprises a second timer structure.

12. The system of claim 9, further comprising:
a first sigma-delta analog to digital converter (ADC) comprised in the first measurement channel; and
a second sigma-delta ADC comprised in the second measurement channel, wherein:
the first means for starting the first measurement channel is configured to start a first decimation counter of the first sigma-delta ADC after expiration of the first delay period; and
the second means for starting the second measurement channel is configured to start a second decimation counter of the second sigma-delta ADC after expiration of the second delay period.

13. The system of claim 9, further comprising:
a first sigma-delta analog to digital converter (ADC) comprised in the first measurement channel; and
a second sigma-delta ADC comprised in the second measurement channel, wherein:
the first means for starting the first measurement channel is configured to set and/or adjust the first delay period by reloading a first decimation counter of the first sigma-delta ADC with a first adjustable value, and
the second means for starting the second measurement channel is configured to set and/or adjust the second delay period by reloading a second decimation counter of the second sigma-delta ADC with a second adjustable value.

14. The system of claim 13, wherein:
the first sigma-delta ADC is configured to discard a first number of decimation samples output by a first decimation filter of the first sigma-delta ADC, and
the second sigma-delta ADC is configured to discard a second number of decimation samples output by a second decimation filter of the second sigma-delta ADC,
wherein the first number of discarded decimation samples is adjustable to further adjust the first delay period and the second number of discarded decimation samples is adjustable to further adjust the second delay period, and wherein the first number of discarded decimation samples and the second number of discarded decimation samples are the same or are different.

15. A system for compensating a delay mismatch between a first measurement channel and a second measurement channel, the system comprising a first sigma-delta analog to digital converter (ADC) comprised in the first measurement channel and a second sigma-delta ADC comprised in the second measurement channel, wherein:
a first decimation counter of the first sigma-delta ADC is started after expiration of a first delay period starting at a predefined reference point; and
a second decimation counter of the second sigma-delta ADC is started after expiration of a second delay period starting at the predefined reference point;
wherein a difference between a length of the first delay period and a length of the second delay period is substantially equal to the delay mismatch between the first measurement channel and the second measurement channel.

16. The system of claim 15, wherein the delay mismatch between the first measurement channel and the second measurement channel is determined in a reference measurement, wherein reference measurement input values are applied to the first measurement channel and the second measurement channel.

17. The system of claim 15, further comprising:
a first timer structure in the first measurement channel configured to set and adjust the first delay period;
a second timer structure in the second measurement channel configured to set and adjust the second delay period.

18. The system of claim 15, wherein the first delay period is set and/or adjusted by reloading the first decimation counter of the first sigma-delta ADC with a first adjustable value and the second delay period is set and/or adjusted by reloading the second decimation counter of the second sigma-delta ADC with a second adjustable value.

19. The system of claim 15, wherein:
the first sigma-delta ADC is configured to discard a first number of decimation samples output by a first decimation filter of the first sigma-delta ADC, and
the second sigma-delta ADC is configured to discard a second number of decimation samples output by a second decimation filter of the second sigma-delta ADC,
wherein the first number of discarded decimation samples is adjustable to further adjust the first delay period and the second number of discarded decimation samples is adjustable to further adjust the second delay period, and wherein the first number of discarded decimation samples and the second number of discarded decimation samples are the same or are different.

20. A system for compensating a delay mismatch between a first measurement channel and a second measurement channel, wherein the system is operable to:
provide a reference point for starting the first measurement channel and the second measurement channel;
start the first measurement channel after expiration of a first delay period which begins at the reference point; and
start the second measurement channel after expiration of a second delay period which begins at the reference point;
wherein a difference between a length of the first delay period and a length of the second delay period is substantially equal to the delay mismatch between the first measurement channel and the second measurement channel.

21. The system of claim 20, wherein the delay mismatch between the first measurement channel and the second measurement channel is determined in a reference measurement, wherein reference measurement input values are applied to the first measurement channel and the second measurement channel.

* * * * *